United States Patent
Sugimoto et al.

(10) Patent No.: US 9,267,743 B2
(45) Date of Patent: Feb. 23, 2016

(54) HOUSING FOR ELECTRONIC EQUIPMENT WITH VARIABLE COOLANT CHANNEL WIDTHS

(71) Applicant: FUJITSU LIMITED, Kawasaki-shi (JP)

(72) Inventors: Toshio Sugimoto, Atsugi (JP); Reiko Kondo, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 488 days.

(21) Appl. No.: 13/763,754

(22) Filed: Feb. 11, 2013

(65) Prior Publication Data

US 2013/0146274 A1   Jun. 13, 2013

Related U.S. Application Data

(63) Continuation of application No. PCT/JP2010/063695, filed on Aug. 12, 2010.

(51) Int. Cl.
*F28F 9/00* (2006.01)
*H05K 7/20* (2006.01)

(52) U.S. Cl.
CPC .............. *F28F 9/00* (2013.01); *H05K 7/20581* (2013.01)

(58) Field of Classification Search
CPC .......... H05K 7/20145; H05K 7/20181; H05K 7/20563; H05K 7/20736; F28F 9/00; F24F 1/14; F24F 1/16
USPC .......... 62/259.2; 361/689, 695, 697, 698, 678, 361/696; 165/287, 121, 96
See application file for complete search history.

(56) References Cited

U.S. PATENT DOCUMENTS

| | | | |
|---|---|---|---|
| 2005/0168945 A1* | 8/2005 | Coglitore | 361/695 |
| 2005/0178133 A1* | 8/2005 | Henry et al. | 62/186 |
| 2006/0176664 A1* | 8/2006 | Casebolt | 361/687 |
| 2008/0043432 A1* | 2/2008 | Hung | 361/695 |
| 2008/0212265 A1 | 9/2008 | Mazura et al. | |

FOREIGN PATENT DOCUMENTS

| | | |
|---|---|---|
| JP | 56-78561 | 6/1981 |
| JP | 63-38300 | 2/1988 |
| JP | 4-005898 | 1/1992 |
| JP | 2003-347781 | 12/2003 |
| JP | 2008-182233 | 8/2008 |

OTHER PUBLICATIONS

International Search Report, mailed in connection with PCT/JP2010/063695 and mailed Sep. 7, 2010.

* cited by examiner

*Primary Examiner* — Marc Norman
(74) *Attorney, Agent, or Firm* — Fujitsu Patent Center (57) ABSTRACT

A housing for electronic equipment includes a fan and a plurality of coolant channels in a passage of a cooling fluid introduced by the fan. A passage width defined by a cooling member blocking the passage, the member being one of the plurality of coolant channels closer to the fan, is smaller than a passage width defined by a cooling member blocking the passage, the member being one of the plurality of coolant channels farther away from the fan.

12 Claims, 9 Drawing Sheets

HOUSING FOR ELECTRONIC EQUIPMENT WITH VARIABLE COOLANT CHANNEL WIDTHS

CROSS-REFERENCE TO RELATED APPLICATION

This application is a continuation Application of a PCT international application No. PCT/JP2010/063695 filed on Aug. 12, 2010 in Japan, the entire contents of which are incorporated by reference.

FIELD

The subject matter of this application relates to a housing for electronic equipment.

BACKGROUND

In information processing apparatuses, such as computers and servers, and communication devices, such as repeaters and exchanges, a trend toward increases in integration density and performance of electronic equipment and electronic components incorporated therein causes an increased amount of heat to generate and thus power consumption for cooling and emitting waste heat to increase. Methods are known that cool the inside of a housing and emit waste heat therefrom with cooling fans installed near heat sources such as a central processing unit (CPU) and a graphic processing unit (GPU) or a case fan that takes in cooling air from the outside of the housing to generate airflows in a housing.

Some of the former methods are applied to a blade server that can contain multiple blades, each of which includes a CPU, a power supply device, an input/output device, and a cooling fan integrated into one narrow-box unit. The blades, each of which can operate as one server, generate heat dependent on each blade in the blade server. For this reason, a cooling fan is provided in each blade depending on the load thereon, and the fans are individually controlled to properly cool the inside of the housing.

Such a method, disadvantageously, needs a larger number of controlled cooling fans with the increase in the number of blades, often resulting in louder noise, a complicated configuration of an apparatus, and increased costs. On the other hand, the latter methods, which distribute the cooling air introduced by case fans around a housing, can solve such a problem.

Some of the latter methods are applied to a tower-model or rack-mount server, the housing of which contains a plurality of electronic circuit packages. For example, a case fan takes in air from the outside of a housing and the air is blown to each electronic circuit package through a duct provided in the housing. Furthermore, a guide member for adjusting the flow rate is disposed in the flow passage of air, and each electronic circuit package is cooled by an airflow volume dependent on the heat.

PRIOR ART

Patent Document

Patent Document 1
Japanese Laid-Open Patent Publication No. 4-5898

Unfortunately, such a conventional method does not take into account the correlation between the cooling efficiency of the cooling air introduced by a case fan and the velocity of the airflow. For example, the velocity of the cooling air is higher at a position closer to a case fan and is lower at a position farther away from the case fan as the distance increases. Thus, despite a uniform distribution of the generated heat in the housing, cooling cannot be uniform, resulting in an uneven distribution of the temperature in the housing.

Furthermore, the cooling efficiency of an air-cooling method utilizing cooling air is susceptible to the temperature of cooling air. Thus, in the case of one room containing multiple housings disposed side by side, for example, a data center and a server room, the heat generated by some of the housings may increase the temperature of cooling air and thus may preclude an improvement in the cooling efficiency.

SUMMARY

A housing for electronic equipment, disclosed herein, includes a fan and a plurality of coolant channels provided in a passage of a fluid introduced to the housing by the fan. A passage width (area, spacing) defined by a cooling member blocking the passage, the member being one of the plurality of coolant channels closer to the fan, is smaller than a passage width defined by a cooling member blocking the passage, the member being one of the plurality of coolant channels farther away from the fan.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 2 illustrates the housing in FIG. 1.

FIG. 4 illustrates a modification of the housing in FIG. 1.

FIG. 6 illustrates intermediate units in FIG. 5.

FIG. 7 illustrates a modification of the intermediate units in FIG. 5.

DESCRIPTION OF EMBODIMENTS

Embodiments will now be described with reference to the drawings. It should be noted that the embodiments are merely examples, and as such are not intended to exclude other possible variations and implementations of the embodiments. That is, the embodiments may also be modified (for example, the embodiments and modifications may be combined with each other) in various manners without deviating from the gist thereof.

First Embodiment

[1-1. Configuration]

Figure 1:
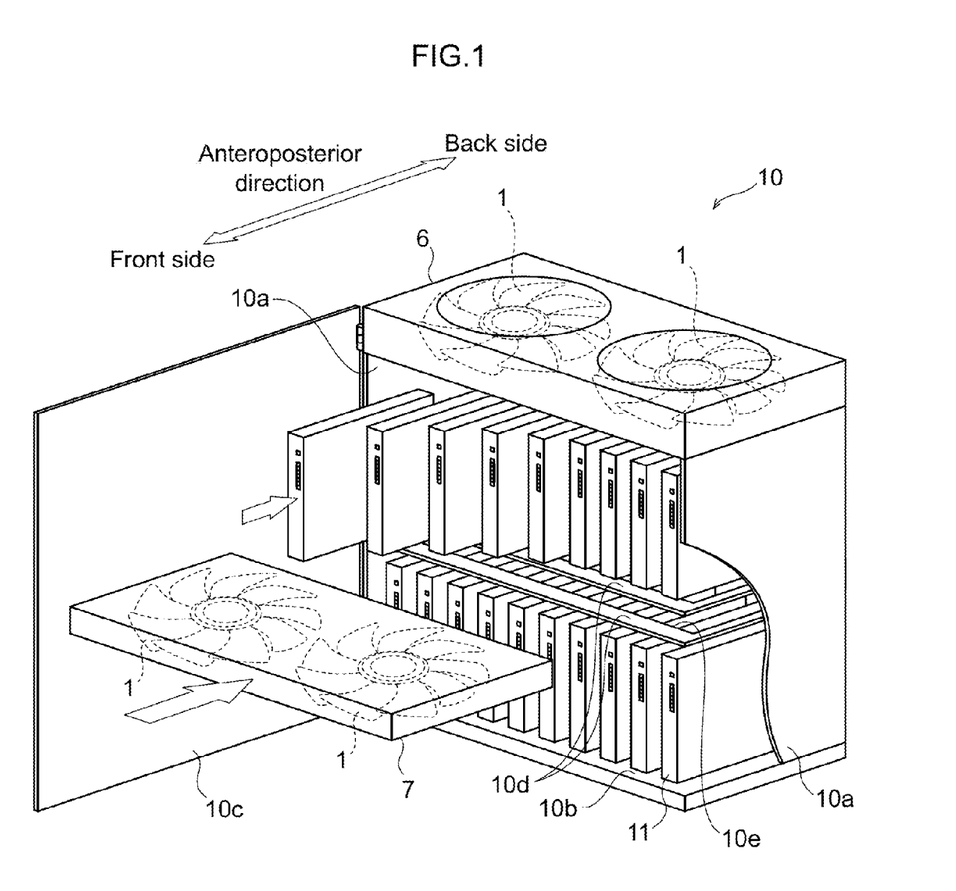
FIG. 1 is a perspective view illustrating the configuration of a housing according to a first embodiment.

FIG. 1 is a perspective view illustrating the configuration of a housing 10 according to a first embodiment. The housing 10 is a substantially rectangular parallelepiped or boxy case and covers electronic equipment (such as a computer, a server, a communications device, and a switchboard). The case holds multiple boards 11 therein. The boards 11 are vertically oriented and arranged with their main surfaces facing the right and left sides of the housing 10 and with predetermined spaces between the adjacent main surfaces of the boards. The housed boards 11 can be selected from a variety of boards, for example, a CPU board, a memory storage board, and a switching board depending on the application of the housing 10. The boards 11 can be independently put in and taken out as appropriate.

A fan unit 6 including a pair of fans 1 is provided on the top of the housing 10. The fans 1 are ventilators for forcibly discharging the air from the inside of the housing 10. Side plates 10a are each provided at the right and left sides of the housing 10, and a bottom plate 10b and a door 10c are provided at the bottom and front of the housing 10, respectively. The door 10c, which is pivotally supported by any one of the side plates 10a through a hinge, opens and closes the front of the housing 10. Note that the boards 11 are put in and taken out with the door 10c opened.

A pair of frames 10d each partitioning the inner space of the housing 10 into the upper and lower portions is horizontally fixed, and the multiple boards 11 are arranged in each housing stage formed by the frames 10d. Each of the frames 10d has rails (not shown) on which the boards 11 slide in the anteroposterior direction of the housing 10 and also has slits 10e for providing airflow in the housing 10. The slits 10e are formed over the substantially entire frames 10d except the rails.

An intermediate fan unit 7 including another pair of fans 1 can be inserted into and extracted from a space between the frames 10d along a sliding mechanism (not shown), as illustrated in FIG. 1. The intermediate fan unit 7 is a ventilator for circulating upward the lower air in the housing 10 and actively (forcibly) generates an airflow inside the housing 10.

Figure 2A:
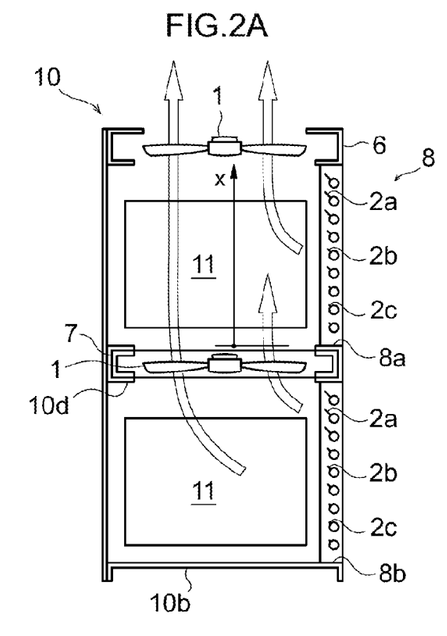
FIG. 2(a) is a longitudinal cross-sectional view.

Openings 8 for taking the outside air (fluid) into the housing 10 as cooling air are provided in the back of the housing 10. Upon the operation of the fans 1, cooling air is introduced into the housing 10 through the openings 8 in the back of the housing 10, and the cooling air flows upward while passing between the boards 11 and through the intermediate fan unit 7 and the fan unit 6, and is discharged from the top of the housing 10, as illustrated in FIG. 2(a) with open arrows. Hereinafter, the opening 8 between the fan unit 6 and the intermediate fan unit 7 is referred to as "first opening 8a"; whereas the opening 8 under the intermediate fan unit 7 is referred to as "second opening 8b."

A coolant pipe 3 (coolant channel) for cooling the cooling air is also provided at the back of the housing 10. A coolant for absorbing heat from the surface of the coolant pipe 3 flows in the coolant pipe 3. The coolant may be of any type; thus, antifreezes such as water and alcohol may also be used.

Figure 2B:
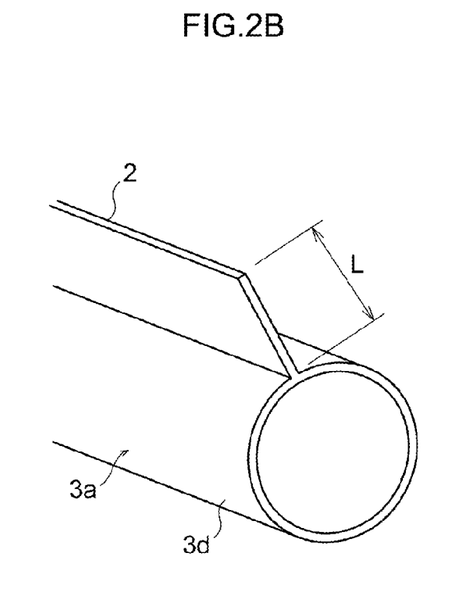
FIG. 2(b) is a perspective cross-sectional view of an airflow control plate and a coolant pipe.
Figure 2C:
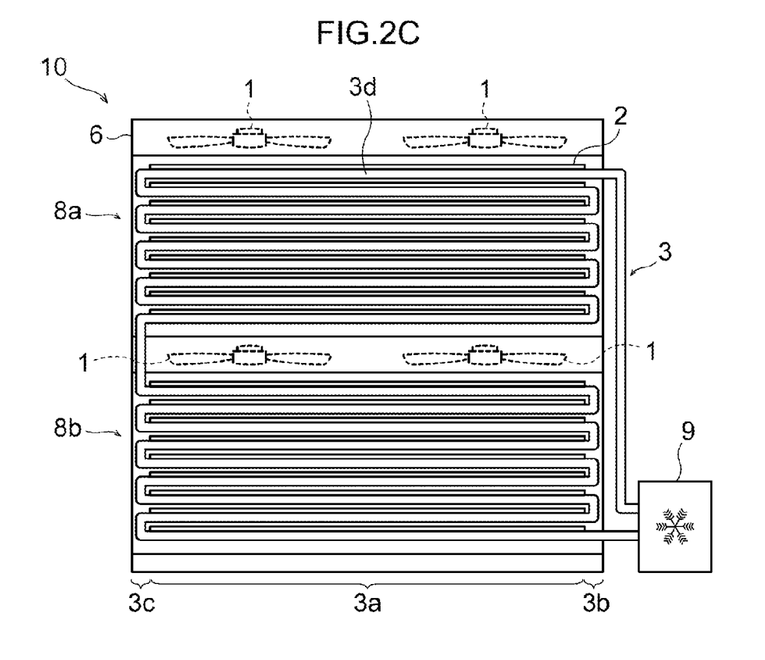
FIG. 2(c) is a rear view of the housing.

The coolant pipe 3 is a meandering tube consisting of vertically arranged pipe segments with spaces therebetween, as illustrated in FIG. 2(c). Both ends of the coolant pipe 3 are connected to a chiller 9 (cooling apparatus) for cooling the coolant.

Now the coolant pipe 3 is divided into three sections based on positions in the cross direction of the housing 10, and these sections are respectively referred to as "horizontal section 3a," "right connection section 3b," and "left connection section 3c." The horizontal section 3a includes tubes 3d disposed like horizontal pipe rows with predetermined intervals therebetween. The length of the intervals between the respective tubes 3d is constant. The tubes 3d horizontally extend toward the first opening 8a or the second opening 8b.

The right connection section 3b connects the right end of each tube in the horizontal section 3a to the right end of one of the tubes immediately thereabove and thereunder in the horizontal section 3a, and the left connection section 3c connects the left end of the tube in the horizontal section 3a to the left end of the other of the tubes directly thereabove and thereunder in the horizontal section 3a.

Airflow control plates 2 are fixed at the peripheries of the tubes 3d in the horizontal section 3a, as illustrated in FIG. 2(b). The airflow control plates 2 protrude onto the passage of the cooling air introduced through the first and second openings 8a and 8b to function as flow resistance to the cooling air. The airflow control plates 2 also extend along the tubes 3d in the horizontal direction of the housing 10, as illustrated in FIG. 2(c).

Although the tubes 3d and the airflow control plates 2 in this embodiment are integrated with the same material, they may also be prepared as separate members and fixed to each other by welding or adhesion.

In the first opening 8a, an upper airflow control plate 2, which is closer to the fans 1, has a longer protruding length L from the corresponding tube 3d; whereas a lower airflow control plate 2, which is farther away from the fans 1, has a shorter protruding length L. Similarly, in the second opening 8b, an upper airflow control plate 2, which is closer to the fans 1, has a longer protruding length L from the corresponding tube 3d; whereas a lower airflow control plate 2, which is farther away from the fans 1, has a shorter protruding length L.

For example, now referring to the airflow control plates 2 in the first opening 8a, a first control plate 2a, a second control plate 2b, and a third control plate 2c having different protruding lengths L are provided in the first opening 8a in this order from top to bottom, as illustrated in FIG. 2(a). The protruding lengths $L_1$, $L_2$, and $L_3$ of these airflow control plates 2 satisfy the following relationship: $L_1 \leq L_2 \leq L_3$ (where $L_1 < L_3$). This holds true for the airflow control plates 2 in the second opening 8b.

As the protruding length L of one of the airflow control plates 2 increases, the contact area of the airflow control plate 2 with the cooling air increases, and thus the flow resistance to the cooling air also increases. Furthermore, a longer protruding length L of one of the airflow control plates 2 reduces the area of the cooling air passage as a result of the blocking by the airflow control plate 2. Thus, the flow of the cooling air is poor at a position closer to the fans 1, resulting in a reduced amount of introduced outside air. In contrast, the flow of the cooling air is smooth at a position farther away from the fans 1, resulting in a relatively increased amount of introduced outside air. As such, the area (width) of the cooling air passage, defined by the coolant pipe 3 and the airflow control plates 2 blocking the passage (the dimension of an opening through which the cooling air flows), is small at a position close to the fans 1 compared with a position far from the fans 1, that is, the passage width defined by the blocking is small, and thus the flow of the cooling air is properly controlled.

[1-2. Operation and Advantageous Effects]

Figure 3:
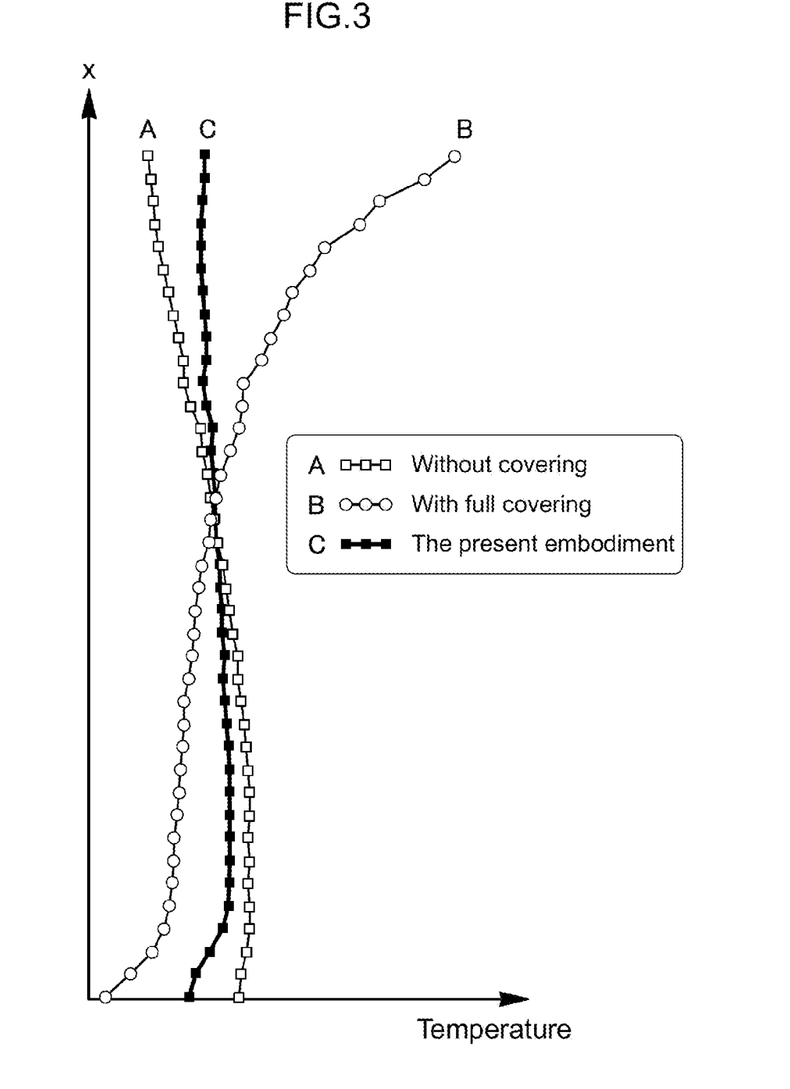
FIG. 3 is a graph illustrating a temperature distribution inside the housing in FIG. 1.

FIG. 3 is a graph illustrating the results of the simulated cooling effect by the cooling air introduced through the first opening 8a. The vertical axis indicates the distance from the bottom of the first opening 8a, whereas the horizontal axis indicates the temperature of the boards 11.

A link line A in FIG. 3 connecting open squares (white squares) indicates the results of the cooling conducted in the housing 10 using only the fan unit 6, without the airflow control plates 2 and the coolant pipe 3 in the first opening 8a (i.e., without covering the first opening 8a). In this case, the temperature at a position farther away from the fans 1 (i.e., a lower position) insufficiently falls due to the reduced cooling efficiency, whereas excess cooling occurs at a position closer to the fans 1 (i.e., an upper position). That is, the vertical temperature distribution in the housing 10 is uneven.

On the other hand, a link line B in FIG. 3 connecting open circles (white circles) indicates the results obtained using the first control plates 2a in place of the second control plate 2b and the third control plate 2c in the present embodiment, namely, by fixing the protruding lengths of all of the airflow control plates 2 to "$L_1$". In this case, increased flow resistance reduces the flow rate of the cooling air introduced in the housing 10, leading to an increased temperature at a position closer to the fans 1. At a position farther away from the fans 1, the cooling air is not easily influenced by the flow resistance due to a low original velocity of the cooling airflow; hence, a slightly increased flow rate improves the cooling efficiency, resulting in excess cooling. That is, the vertical temperature distribution in the housing 10 is uneven also in this case.

A link line C in FIG. 3 connecting filled squares (black squares) indicates the results in the present embodiment. In this case, the airflow control plates 2 and the coolant pipe 3 are disposed in the first opening 8a. The protruding lengths L of the airflow control plates 2 are longer at a position closer to the fans 1 and are shorter at a position farther away from the fans 1. Thus, the temperature distribution in the housing 10 is uniform.

That is, the suppression of the flow rate of the cooling air introduced from an upper part relatively improves the cooling efficiency at a position farther away from the fans 1, leading to an improvement in the cooling effect. Furthermore, since the flow resistance to the cooling air is high at a position closer to the fans 1 compared with the case of not covering the first opening 8a, the cooling effect (excess cooling) near the fans 1 is suppressed.

Thus, the control of the cooling airflow can make the vertical temperature distribution in the housing 10 uniform irrespectively of the distance from the fans 1, thereby enhancing the cooling efficiency. Furthermore, the airflow control plates 2, which are fixed to the coolant pipe 3, can cool the cooling air introduced into the housing 10, and thus can further enhance the cooling efficiency.

The relative values of the flow resistance and the flow rate of the cooling air can be readily adjusted by, for example, increasing the ratio or area of the opening at a position farther away from the fans 1 compared to a position closer to the fans 1, which can lead to an improvement in the cooling effect.

The cooling air is cooled by the coolant in the coolant pipe 3 immediately after entering the housing 10; hence, the air cooled upon the introduction can generate an airflow in the housing 10 even in the case of a high temperature of the room including the housing 10, which can further enhance the cooling efficiency.

Furthermore, since the airflow control plates 2 are horizontally disposed at intervals in the back of the housing 10, the vertical distribution of the inflow of cooling air is readily controlled. As a result, the uniformity of the vertical temperature distribution in the housing 10 and the cooling efficiency can be improved.

The present embodiment can also be combined with a water cooling scheme to reduce the speed of revolutions of the fans 1 as well as noise and vibrations in the housing 10. The present embodiment employs not only mere combination of air cooling and water cooling, but also additional water cooling of the air-cooled surfaces of the airflow control plates 2. That is, the water cooling adopted in the present embodiment lowers the temperature of the cooling air for air cooling in advance, instead of absorbing the heat of heat sources. Thus, a thermal conductor for transferring the heat of heat sources into the coolant is not needed, which can lead to an improvement in the total cooling efficiency.

The intermediate fan unit 7 is detachable from the housing 10 in the present embodiment; hence, a fan can be added or replaced as appropriate, which improves the cooling efficiency. Furthermore, since the coolant pipe 3 and the airflow control plates 2 in the present embodiment are integrated as illustrated in FIG. 2(b), the heat of the cooling air in contact with the surfaces of the airflow control plates 2 can be efficiently absorbed by the coolant, which can improve the cooling efficiency.

[1-3. Modification]

Figure 4A:
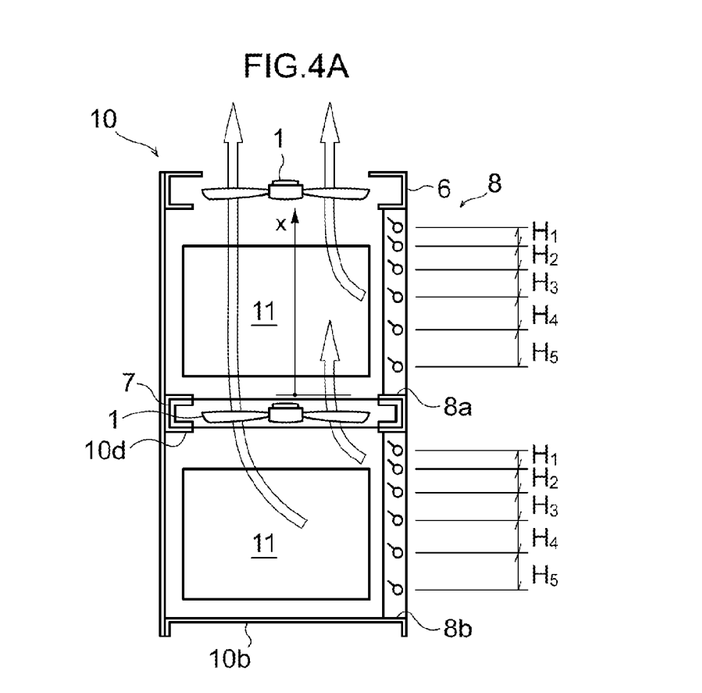
FIG. 4(a) is a longitudinal cross-sectional view.
Figure 4B:
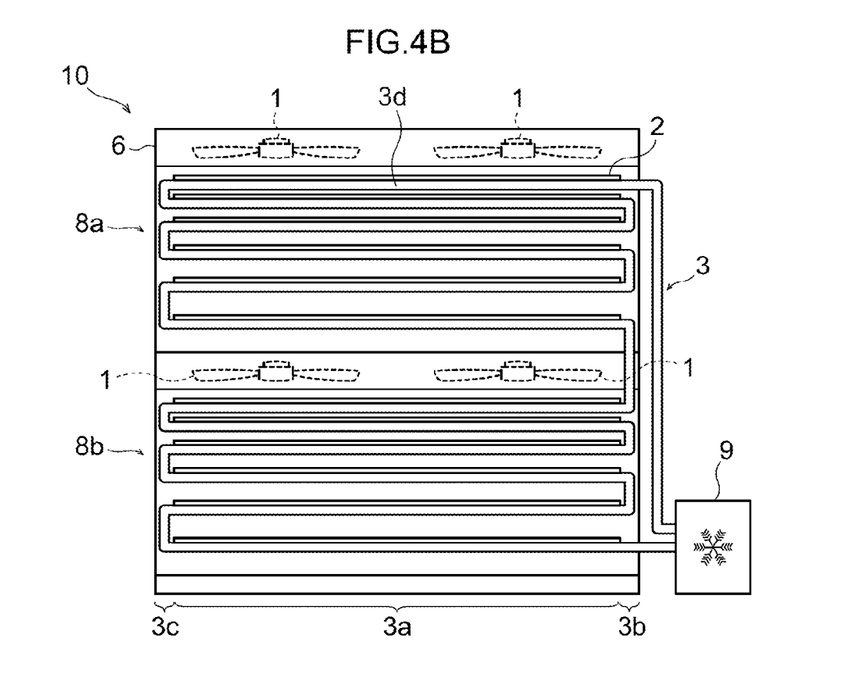
FIG. 4(b) is a rear view.

A modification of the first embodiment is illustrated in FIGS. 4(a) and 4(b). In this modification, intervals between the tubes 3d of the coolant pipe 3 (coolant channel) provided at the back of the housing 10 are different from those of the first embodiment. Note that the same components as those in the first embodiment will be labeled with the same reference numerals to omit redundant description thereof.

$H_1, H_2, \ldots H_5$ are assigned to the intervals H of the tubes 3d in this order from top to bottom as illustrated in FIGS. 4(a) and 4(b). The following relationship holds: $H_1 \leq H_2 \leq \ldots \leq H_5$ (where $H_1 < H_5$). That is, the upper sides, closer to the fans 1, of the first opening 8a and the second opening 8b have smaller intervals between the tubes 3d, and the intervals are larger at positions farther away from the fans 1.

That is, the density of the airflow control plates 2 is higher at a position closer to the fans 1 and is lower at a position farther away from the fans 1. Furthermore, the spaces of the coolant pipe 3 are smaller at a position closer to the fans 1 (i.e., the areas (widths) of the cooling air passage, which is blocked by the coolant pipe 3, are smaller) and are larger at a position farther away from the fans 1 (i.e., the areas (widths) of the cooling air passage are larger).

Note that all the protruding lengths L of the airflow control plates 2 may be the same, or upper areas, closer to the fans 1, of the first opening 8a and the second opening 8b may have plates of longer protruding lengths L, whereas lower areas, farther away from the fans 1, of the first opening 8a and the second opening 8b may have plates of shorter protruding lengths L.

A smaller interval H of the tubes 3d reduces the substantial ratio of the opening (an opening area per unit area) through which the cooling air flows into the housing 10, leading to an increase in flow resistance to the cooling air.

Thus, the flow of the cooling air is poor at a position closer to the fans 1 and is smoother at a position farther away from the fans 1, resulting in a relatively increased volume of introduced outside air. That is, the flow of the cooling air is properly controlled.

Also in such a configuration, the cooling efficiency at a position far from the fans 1 is relatively improved by the suppression of the flow rate of the cooling air introduced from an upper part, and thus the cooling effect is improved. That is, reducing the density of the airflow control plates 2 and the coolant pipe 3 at a position farther away from the fans 1 increases the flow rate of the cooling air. At a position close to the fans 1, since the flow resistance to the cooling air is increased due to the high density of the airflow control plates 2 and the coolant pipe 3 compared with the case of not covering the first opening 8a, a cooling effect (excess cooling) near the fans 1 is suppressed.

Thus, a uniform temperature can be achieved in the housing 10 irrespectively of the distance from the fans 1, which can enhance the cooling efficiency. Furthermore, since the coolant pipe 3 is fixed to the airflow control plates 2, the cooling air can be cooled upon the introduction into the housing 10, and thus the cooling efficiency can be further enhanced.

Furthermore, since the airflow control plates 2 are horizontally disposed at intervals in the back of the housing 10, the vertical distribution of the inflow of cooling air is readily controlled. As a result, the uniform vertical distribution of the temperature can be achieved in the housing 10, and thus the cooling efficiency can be improved.

Second Embodiment

[2-1. Configuration]

Figure 5:
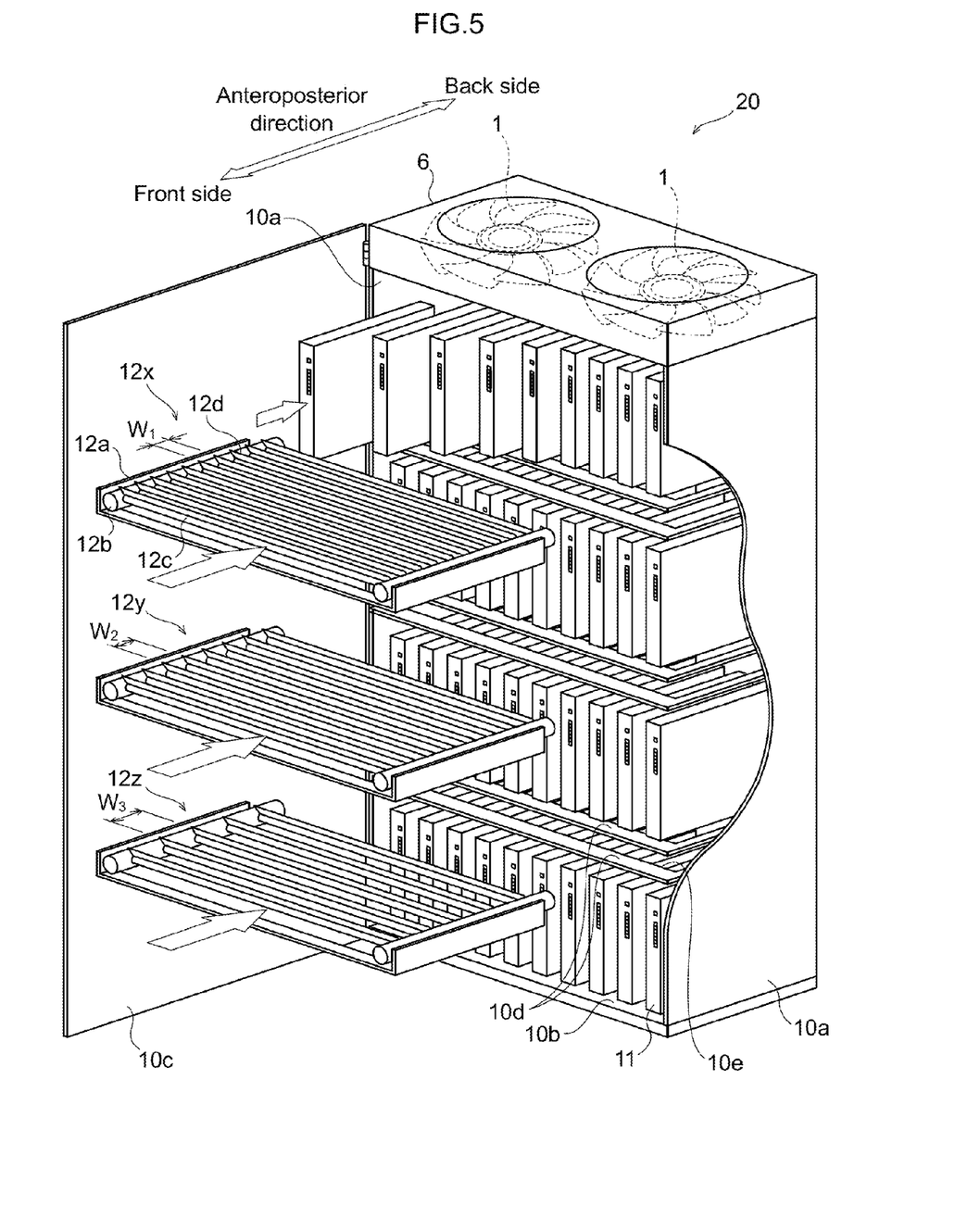
FIG. 5 is a perspective view illustrating the configuration of a housing according to a second embodiment.

FIG. 5 is a perspective view illustrating the configuration of a cooling apparatus of a housing 20 according to a second embodiment. Note that the same components as those in the first embodiment will be labeled with the same reference numerals to omit redundant description thereof.

The housing 20 corresponds to the housing 10 of the first embodiment that includes an additional housing stage for boards 11, other pairs of frames 10d, and airflow control units 12 each disposed between the adjacent frames 10d. The airflow control units 12 actively (forcibly) control the flow rate (airflow volume) by varying the area of the passage of the cooling air that flows upward through the slits 10e of the frames 10d. Note that the same opening 8 as that in the first embodiment is provided at the back of the housing 20. The airflow control plates 2 and the coolant pipe 3 may or may not be provided at the opening 8.

Figure 6A:
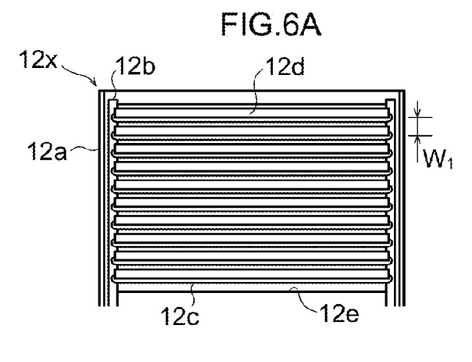
FIG. 6(a) is a top view of an upper intermediate unit.

The airflow control units 12 each include a unit frame 12a, a pair of support pipes 12b, multiple horizontal pipes 12c, and airflow control plates 12d, as illustrated in FIG. 6(a).

The unit frame 12a, having picture-frame structure, can be inserted into and extracted from a space between the adjacent frames 10d along a sliding mechanism (not shown). A frame opening 12e having substantially the same area as that of the slits 10e is provided at the center of the unit frame 12a.

The support pipes 12b are hollow tubes for carrying coolant similarly to the above-described coolant pipe 3 and are each fixed to the two sides of the unit frame 12a. The coolant is supplied by the above-described chiller 9 connected to the support pipes 12b. The support pipes 12b slide along the inner surfaces of the side plates 10a of the housing 20 when the unit frame 12a is inserted into a space between the frames 10d.

The horizontal pipes 12c (coolant channels) are hollow tubes connecting the pair of support pipes 12b together. The inner spaces of the horizontal pipes 12c communicate with those of the support pipes 12b, and coolant flows in the pipes. The horizontal pipes 12c are orthogonal to the support pipes 12b, and the horizontal pipes 12c are disposed with predetermined intervals W therebetween. In other words, the horizontal pipes 12c are disposed as horizontal rows. The horizontal pipes 12c extend toward the frame opening 12e.

The airflow control plates 12d are fixed at the peripheries of the horizontal pipes 12c, similarly to the above-described airflow control plates 2. The airflow control plates 12d protrude onto the passage of the cooling air flowing through the slits 10e and function as flow resistance to the cooling air. The airflow control plates 12d of the horizontal pipes 12c each have the same slope and the same protruding length L. Note that the horizontal pipes 12c and the airflow control plates 12d may be integrated with the same material, or they may also be fixed to each other by welding or adhesion.

Hereinafter, the airflow control units 12 in the housing 20 are respectively referred to as "first airflow control unit 12x," "second airflow control unit 12y," and "third airflow control unit 12z" in this order from top to bottom as illustrated in FIG. 5, for the purpose of distinguishing the airflow control units 12 from each other on the basis of their positions. A lower one of the airflow control units 12 in the housing 20 has smaller numbers of the horizontal pipes 12c and the airflow control plates 12d.

Figure 6B:
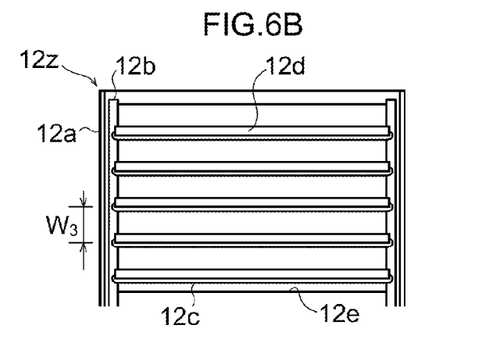
FIG. 6(b) is a top view of a lower intermediate unit.

For example, FIG. 6(a) corresponds to the first airflow control unit 12x, and FIG. 6(b) the third airflow control unit 12z. The number of the horizontal pipes 12c in the first airflow control unit 12x is larger than each of the numbers of the other airflow control units 12y and 12z, that is, the first airflow control unit 12x has the closely disposed horizontal pipes 12c (i.e., high density). In contrast, the number of the horizontal pipes 12c in the third airflow control unit 12z is smaller than each of the numbers of the other airflow control units 12x and 12y, that is, the third airflow control unit 12z has the sparsely disposed horizontal pipes 12c (i.e., low density). The number of the horizontal pipes 12c in the second airflow control unit 12y, which is not illustrated in FIG. 6, is smaller than that in the first airflow control unit 12x and larger than that in the third airflow control unit 12z.

The intervals $W_1$, $W_2$, and $W_3$ of the horizontal pipes 12c in the first airflow control unit 12x, the second airflow control unit 12y, and the third airflow control unit 12z, respectively, satisfy the following relationship: $W_1 \leq W_2 \leq W_3$ (where $W_1 < W_3$). Since the airflow control plates 12d are each provided at their respective horizontal pipes 12c, the intervals of the horizontal pipes 12c are equal to those of the airflow control plates 12d.

[2-2. Operation and Advantageous Effects]

As the intervals W of the horizontal pipes 12c decrease, the contact area of the airflow control plates 12d with the cooling air increases, and thus the flow resistance to the cooling air also increases. That is, the flow of the cooling air is poor at a position closer to the fans 1, resulting in a reduced amount of introduced outside air. In contrast, the flow of the cooling air is smooth at a position farther away from the fans 1, resulting in a relatively increased amount of introduced outside air. As such, the area of the cooling air passage, defined by the coolant pipe 3 and the airflow control plates 2 blocking the passage (the dimension of an opening through which the cooling air flows), is small at a position close to the fans 1 compared with a position far from the fans 1, that is, the passage area defined by the blocking is small, and thus the flow of the cooling air is properly controlled.

Thus, similarly to the first embodiment, the vertical temperature distribution in the housing 20 can be made uniform irrespectively of the distance from the fans 1, and thereby the cooling efficiency can be enhanced. Furthermore, since the horizontal pipes 12c are fixed to the airflow control plates 12d, the cooling air can be cooled in the housing 20. That is, the coolant can absorb the heat generated by the boards 11, thereby enhancing the cooling efficiency.

Furthermore, since the airflow control units 12 are horizontally disposed at intervals in the housing 20, the vertical distribution of the flow rate and velocity of cooling air is readily controlled. As a result, the uniformity of the vertical temperature distribution in the housing 20 and the cooling efficiency can be improved.

[2-3. Modification]

Figure 7A:
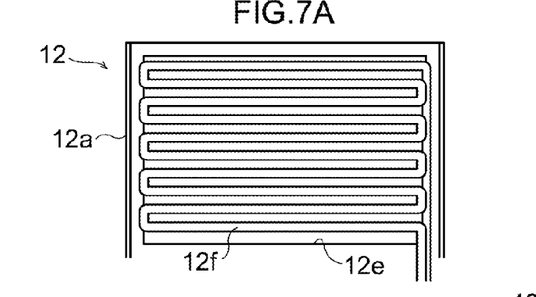
FIG. 7(a) is a top view of one of the intermediate units.
Figure 7B:
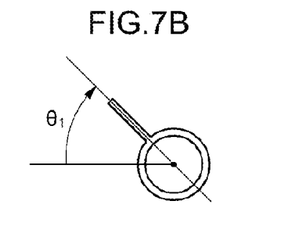
FIG. 7(b) is a partial cross-sectional view of an upper intermediate unit.
Figure 7C:
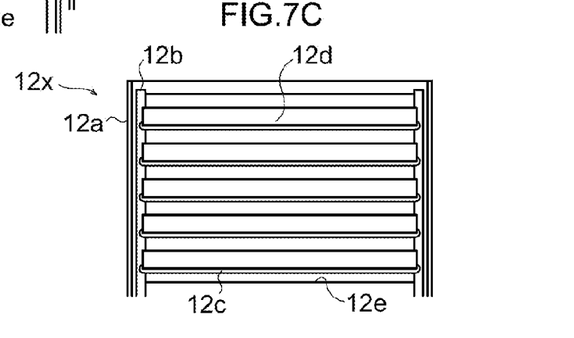
FIG. 7(c) is a top view of the upper intermediate unit.
Figures 7D, 7E:
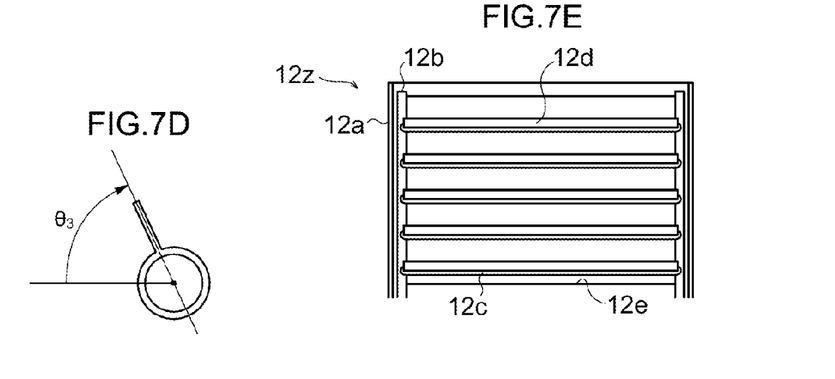
FIG. 7(d) is a partial cross-sectional view of a lower intermediate unit.
FIG. 7(e) is a top view of the lower intermediate unit.

A modification of the second embodiment is illustrated in FIGS. 7(a) to 7(c). This modification differs from the second embodiment in the shapes of the airflow control units 12, the support pipes 12b, and the horizontal pipes 12c. Note that the same components as those in the second embodiment will be labeled with the same reference numerals to omit redundant description thereof.

In FIG. 7(a), a meandering pipe 12f, formed by bending one tube, is substituted for the support pipes 12b and the horizontal pipes 12c. The meandering pipe 12f is a hollow tube for carrying coolant similarly to the above-described coolant pipe 3 and is fixed to the two sides of the unit frame 12a. The meandering pipe 12f meanders like apparent horizontal rows having predetermined intervals therebetween.

Since one passage for coolant is provided in this configuration, a meandering pipe 12f having a constant cross-sectional area can lead to a constant velocity of the flowing coolant throughout the meandering pipe 12f, resulting in uniform cooling performance. For example, the housing 20 can have a uniform horizontal temperature distribution.

FIGS. 7(b) to 7(e) illustrate the first airflow control unit 12x, the second airflow control unit 12y, and the third airflow control unit 12z having the same number and intervals of horizontal pipes 12c but different inclination angles of airflow control plates 12d. FIGS. 7(b) and 7(c) correspond to the first airflow control unit 12x; whereas FIGS. 7(d) and 7(e) correspond to the third airflow control unit 12z.

The airflow control plates 12d of the first airflow control unit 12x define an angle that offers greater flow resistance to the cooling air than that of the other airflow control units 12y and 12z. In contrast, the airflow control plates 12d of the third airflow control unit 12z define an angle that offers smaller flow resistance to the cooling air than that of the other airflow control units 12x and 12y. The airflow control plates 12d of the second airflow control unit 12y, which is not illustrated in FIG. 6, define an angle within the range between the angle of the airflow control plates 12d of the first airflow control unit 12x and the angle of the airflow control plates 12d of the third airflow control unit 12z.

The angles $\theta_1$, $\theta_2$, and $\theta_3$ formed between the horizontal plane and the surfaces of the airflow control plates 12d in the first airflow control unit 12x, the second airflow control unit 12y, and the third airflow control unit 12z, respectively, satisfy the following relationship: $\theta_1 \leq \theta_2 \leq \theta_3$ (where $\theta_1 < \theta_3$). That is, an upper one of the airflow control plates 12d in the housing 20 defines an angle closer to the horizontal; whereas a lower one inclines toward the flowing direction of the cooling air (i.e., defines an angle closer to the vertical).

As a result, the airflow control plates 12d offer greater flow resistance at a position closer to the fans 1; whereas the flow resistance is reduced at a position farther away from the fans 1. Thus, the flow rate of the cooling air can be increased at a position far from the fans 1, and similarly to the above-described embodiment, the housing 20 can have a uniform vertical temperature distribution irrespectively of the distance from the fans 1, and thereby the cooling efficiency can be enhanced.

Third Embodiment

[3-1. Configuration]

Figure 8:
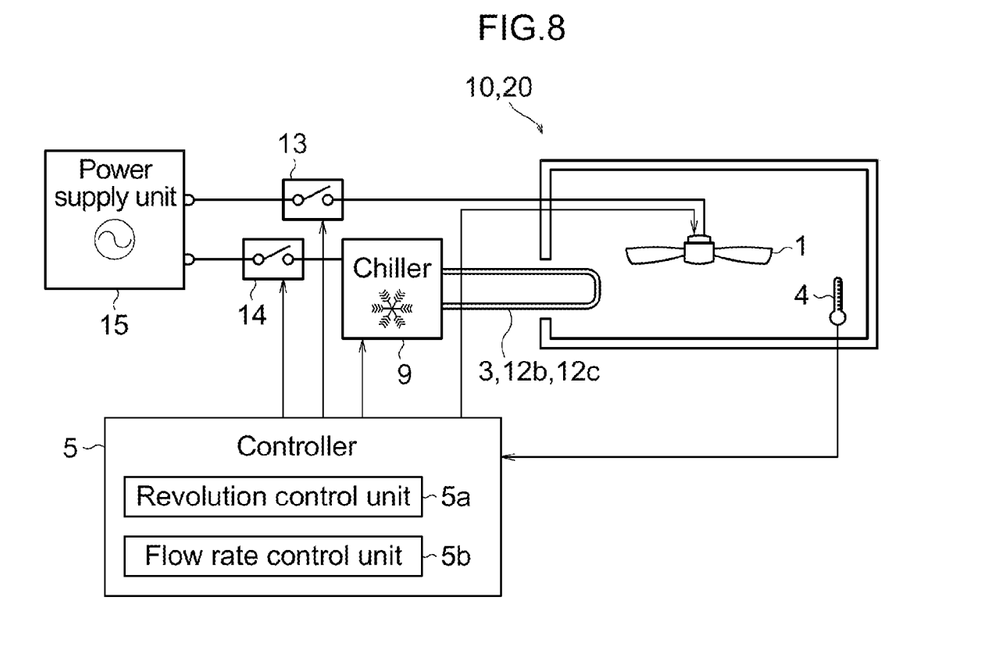
FIG. 8 is a block diagram illustrating the configuration of a housing according to a third embodiment.

FIG. 8 is a block diagram of a cooling apparatus for the housing 10 or 20 according to a third embodiment. In this embodiment, the cooling apparatus according to the first or second embodiment is controlled by a controller 5. The controller 5 is an electronic control device that is an LSI (Large Scale Integration) device incorporating well-known components such as a microprocessor, ROM (Read Only Memory), and RAM (Random Access Memory) therein. The housing 10 or 20 includes a temperature sensor 4, at any position, for detecting the temperature of cooling air and the temperature around the boards 11. The information on the temperature T detected by the temperature sensor 4 is transferred to the controller 5.

The temperature sensor 4 is preferably disposed inside or near any component or device that is included in the housing 10 or 20 and needs accurate temperature control (e.g., a CPU on the board 11).

The fans 1 are connected to a power supply unit 15 via a first switch 13. The first switch 13 enables and disables the power supply to the fans 1. The fans 1 each include a fan motor (not shown) that can change the speed of revolutions to any value.

The chiller 9 is connected to the power supply unit 15 via a second switch 14. The second switch 14 enables and disables the power supply to the chiller 9, similarly to the first switch 13. The flow rate of the coolant supplied by the chiller 9 can be set at any level with a valve (not shown).

An input port of the controller 5 is connected to the temperature sensor 4, whereas output ports are connected to the first switch 13, the second switch 14, the fans 1, and the chiller 9 (i.e., controlled targets). The controller 5 includes a revolution control unit 5a and a flow rate control unit 5b. The revolution control unit 5a (revolution controller) controls the speed of revolutions of the fans 1 on the basis of the temperature T detected by the temperature sensor 4. The flow rate control unit 5b (flow rate controller) controls the flow rate of the coolant on the basis of the temperature T [° C.] detected by the temperature sensor 4.

The following description illustrates three modes of the control carried out by the controller 5.

[3-2. First Control Mode]

Figure 9:
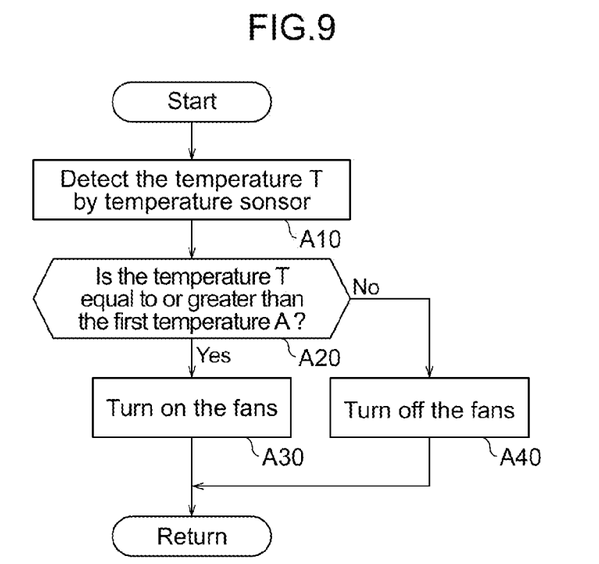
FIG. 9 is a flow chart illustrating a first control mode of a cooling apparatus in FIG. 8.

A flow chart according to a first control mode is illustrated in FIG. 9. The first control turns on or off the fans 1 on the basis of the temperature T. The control keeps the chiller 9 operating continuously.

For example, in Step A10, the information on the temperature T detected by the temperature sensor 4 is input to the controller 5. In Step A20, the revolution control unit 5a determines whether the temperature T is equal to or greater than a preset first temperature A. If the temperature T is equal to or greater than the first temperature A, the process proceeds to Step A30 to transfer signals for turning on the fans 1 from the revolution control unit 5a to the fans 1 or the first switch 13.

If the temperature T is smaller than the first temperature A, the process proceeds to Step A40 to transfer signals for turning off the fans 1 from the revolution control unit 5a to the fans 1 or the first switch 13.

In this manner, the fans 1 are switched on and off depending on the first temperature A used as a threshold, and thus the temperature T in the housing 10 or 20 can be maintained around the first temperature A.

[3-3. Second Control Mode]

Figure 10:
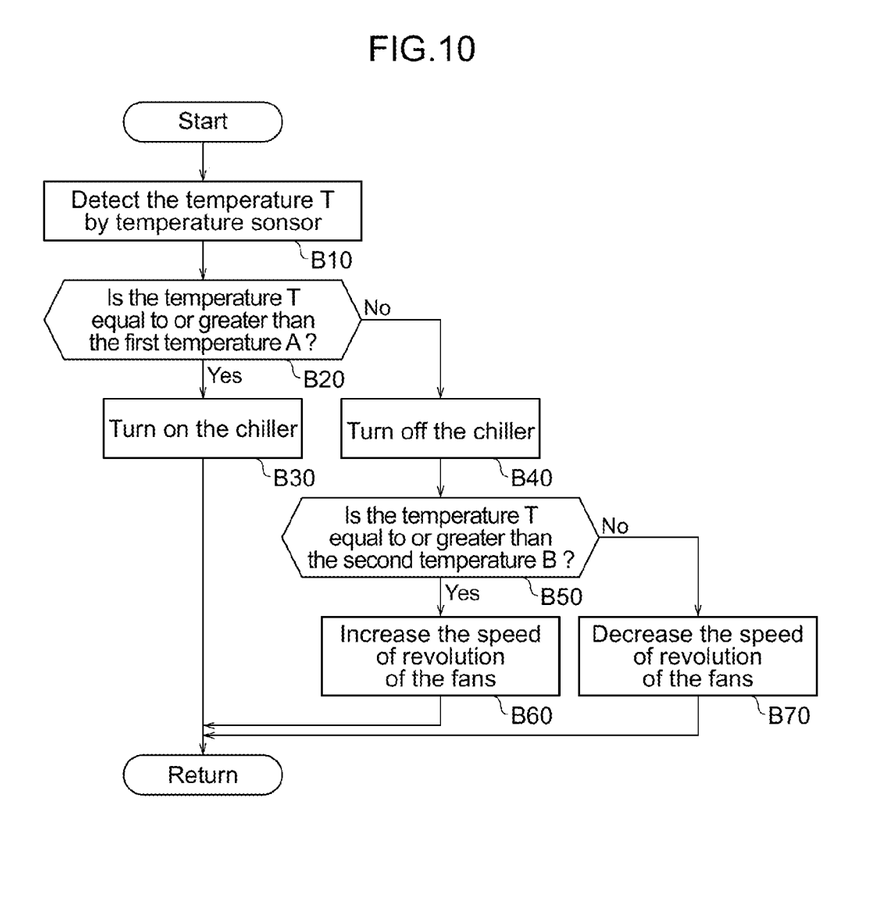
FIG. 10 is a flow chart illustrating a second control mode of the cooling apparatus in FIG. 8.

A flow chart according to a second control mode is illustrated in FIG. 10. The second control controls the fans 1 and the chiller 9 on the basis of the temperature T. The second control cools the housing 10 or 20 using only the fans 1 while the temperature T is smaller than the first temperature A, and turns on the chiller 9 when the temperature T becomes equal to or greater than the first temperature A.

For example, in Step B10, the information on the temperature T detected by the temperature sensor 4 is input to the controller 5. In Step B20, the flow rate control unit 5b determines whether the temperature T is equal to or greater than the preset first temperature A. If the temperature T is equal to or greater than the first temperature A, the process proceeds to Step B30 to transfer signals for turning on the chiller 9 from the flow rate control unit 5b to the chiller 9 or the second switch 14. Note that this step may also transfer signals from the revolution control unit 5a to the fans 1 so as to set the speed of revolutions of the fans 1 at the preset smallest speed.

In contrast, if the temperature T is smaller than the first temperature A, the process proceeds to Step B40 to transfer signals for turning off the chiller 9 from the flow rate control unit 5b to the chiller 9 or the second switch 14. In Step B50, the revolution control unit 5a determines whether the temperature T is equal to or greater than a preset second temperature B. The second temperature B is lower than the first temperature A (B<A).

If the temperature T is equal to or greater than the second temperature B, the process proceeds to Step B60 to transfer signals for increasing the speed of revolutions of the fans 1 from the revolution control unit 5a to the fans 1. If the temperature T is lower than the second temperature B, the process proceeds to Step B70 to transfer signals for decreasing the speed of revolutions of the fans 1 from the revolution control unit 5a to the fans 1. Note that different second temperatures B may also be each associated with its specific target speed of revolutions of the fans 1 in order to more flexibly control the speed of revolutions.

As such, the second control controls the speed of revolutions of the fans 1 on the basis of the temperature T of cooling air. In a cooling system that employs combination of air cooling and water cooling, the ratio of the burden on the cooling can be varied by controlling the air-cooling performance, which can improve the cooling efficiency.

In the case of a relatively low temperature T that is lower than the first temperature A, excess cooling in the housing 10 or 20 can be suppressed by turning off the chiller 9.

If the temperature T becomes equal to or greater than the first temperature A, the chiller 9 is turned on to conduct water cooling control with high cooling efficiency, which can prevent a further increase in the temperature T. In the case of a significantly light load such that the temperature T is lower than the second temperature B, the speed of revolutions of the fans 1 can be reduced for the reduction in noise and power consumption.

[3-4. Third Control Mode]

Figure 11:
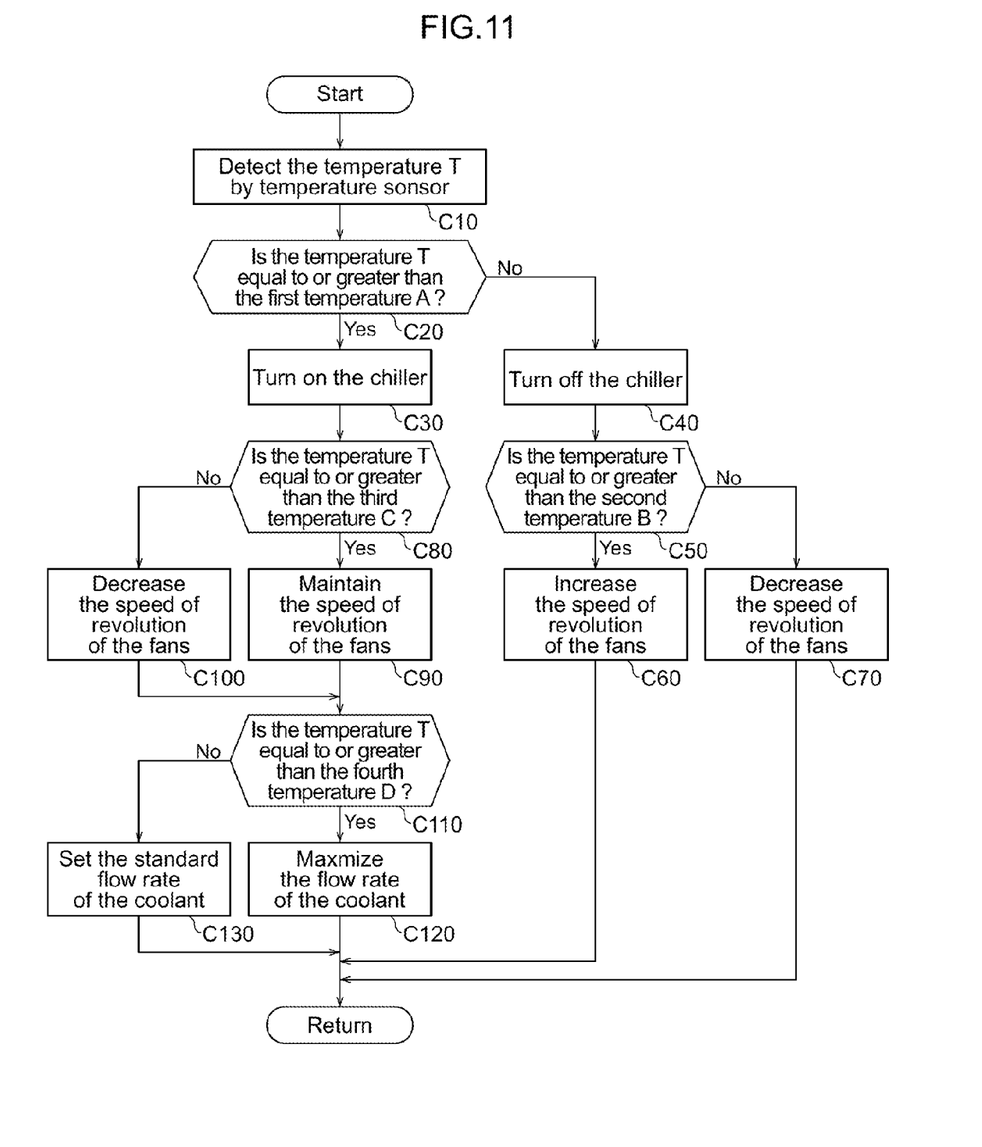
FIG. 11 is a flow chart illustrating a third control mode of the cooling apparatus in FIG. 8.

A flow chart according to a third control mode is illustrated in FIG. 11. The third control controls the fans 1 and the chiller 9 on the basis of the temperature T, and Steps C10 to C70 correspond to Steps B10 to B70 in the second control. In Step C80 and the subsequent steps, the speed of revolutions of the fans 1 varies during the operation of the chiller 9 and the flow rate of coolant is changed depending on the temperature T. It is noted that two flow rates, i.e., a standard rate and a maximum rate are preliminarily determined for the coolant supplied by the chiller 9.

Step C80 follows Step C30 where the signals for turning on the chiller 9 are transferred from the flow rate control unit 5b to the chiller 9 or the second switch 14. In Step C80, the revolution control unit 5a determines whether the temperature T is equal to or greater than a preset third temperature C. The third temperature C is higher than the first temperature A (A<C).

If the temperature T is equal to or greater than the third temperature C, the process proceeds to Step C90 to transfer signals for maintaining the speed of revolutions of the fans 1 from the revolution control unit 5a to the fans 1. If the temperature T is smaller than the third temperature C, the process proceeds to Step C100 to transfer signals for decreasing the speed of revolutions of the fans 1 from the revolution control unit 5a to the fans 1.

In Step C110, the flow rate control unit 5b determines whether the temperature T is equal to or greater than a preset fourth temperature D. The fourth temperature D is higher than the first temperature A (A<D) and independent of the third temperature C.

If the temperature T is equal to or greater than the fourth temperature D, the process proceeds to Step C120 to transfer signals for maximizing the flow rate of the coolant, from the flow rate control unit 5b to the chiller 9. If the temperature T is smaller than the fourth temperature D, the process proceeds to Step C130 to transfer signals for setting the standard flow rate of the coolant, from the flow rate control unit 5b to the chiller 9.

As described above, the third control controls the flow rate of coolant on the basis of the temperature T of the cooling air, in addition to the second control. Thus, the ratio of the burden on the cooling can be more flexibly varied in a cooling system that employs combination of air cooling and water cooling, which can improve the cooling efficiency.

If the temperature T is smaller than the third temperature C, the revolution of the fans 1 is reduced to decrease noise and power consumption. If the temperature T is equal to or greater than the third temperature C, the revolution of the fans 1 is maintained to ensure the cooling.

At a high temperature T equal to or greater than the fourth temperature D, the flow rate of coolant supplied by the chiller 9 is set at the maximum, which can more effectively prevent a further increase in the temperature T.

4. Supplement

The above-described embodiments may be modified in various manners without deviating from the gist thereof. The appropriate configurations and processes can be chosen as needed from those in the embodiments, or the configurations or processes may also be combined with each other as needed.

The housing 10 or 20 in the above-described embodiments takes in cooling air through the opening 8 provided at the back; however, the opening 8 may also be provided at the side plates 10a or the door 10c of the housing 10 or 20, for example.

The airflow control plates 2 are fixed to the periphery of the coolant pipe 3 in the above-described embodiments; however, hollow airflow control plates 2 may also be prepared and coolant may flow therein, for example. Alternatively, the airflow control plates 2 may also be partially bonded to the surface of the coolant pipe. Any structure can be employed that allows coolant to absorb the heat from the cooling air contacting the surfaces of the airflow control plates 2.

Furthermore, the control of the speed of revolutions of the fans 1 in the third embodiment may increase or decrease the speed of revolutions by any value. For example, the value may be a predetermined increment or decrement or may also be varied depending on the temperature T. The speed of revolutions may also be changed in any manner, for example, suddenly, gradually, or stepwise (i.e., a discrete change in the speed of revolutions).

Note that the housings 10 and 20 in the above-described embodiments and modifications may be of any type. For example, if the housing 10 or 20 is a shelf or rack for a server apparatus or a disk array, the boards 11 may be CPU modules, storage modules, or power supply modules. If the housing 10 or 20 is used for a chassis of a network communication apparatus, the boards 11 may be interface modules specific for a variety of communication standards.

According to the technique disclosed herein, the flow of the cooling air in the housing can be controlled with a simple configuration.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A housing for electronic equipment with variable coolant channel widths, comprising:
   a fan that exhausts a fluid introduced into the housing through the upward direction of the housing;
   a plurality of coolant channels having a tubular shape, provided in back of the housing to form a passage of the fluid introduced to the housing by the fan; and
   a chiller connected to the plurality of coolant channels, configured to supply a coolant for absorbing heat of the fluid, the coolant being carried in the tubular shape,
   wherein a passage width formed by a pair of the coolant channels blocking the passage becomes larger as the passage becomes far from the fan.

2. The housing according to claim 1, further comprising a plurality of airflow control plates provided in the passage as flow resistances to the fluid, wherein
   the plurality of airflow control plates include a first control plate and a second control plate, the first control plate being closer to the fan than the second control plate in the passage, the flow resistance of the second control plate to the fluid being lower than the resistance of the first control plate.

3. The housing according to claim 2, wherein the plurality of airflow control plates are horizontally disposed at intervals.

4. The housing according to claim 2, wherein the plurality of airflow control plates are horizontally disposed in the housing at intervals.

5. The housing according to claim 2, further comprising:
   a temperature sensor that detects a temperature of the fluid; and
   a revolution controller that controls the speed of revolutions of the fan on the basis of the temperature detected by the temperature sensor.

6. The housing according to claim 5, further comprising a flow rate controller that controls a flow rate of the coolant in the coolant channels on the basis of the temperature detected by the temperature sensor.

7. The housing according to claim 2, wherein the fan is attachable to and detachable from the housing.

8. The housing according to claim 2, wherein
   the plurality of airflow control plates extend from surfaces of the tubular coolant channels vertically with respect to a tube axis and are integrated with the plurality of coolant channels.

9. The housing according to claim 2, wherein the second control plate defines an opening ratio or opening area for the flow of the fluid larger than an opening ratio or opening area defined by the first control plate.

10. The housing according to claim 2, wherein the second control plate is inclined toward a flowing direction of the fluid compared with the first control plate.

11. The housing according to claim 2, wherein the second control plate is sparsely disposed compared with the first control plate.

12. A housing with variable coolant channel widths including electronic equipment therein, the housing comprising:
   a fan provided in the housing and exhausts a fluid introduced into the housing through the upward direction as a cooling fluid to be supplied to the electronic equipment included in the housing;
   a plurality of airflow control plates disposed in a passage of the fluid at back of the housing as flow resistances to the fluid;
   a plurality of coolant channels having a tubular shape, provided at the plurality of airflow control plates and configured to carry a coolant for absorbing heat of the fluid; and
   a chiller connected to the plurality of coolant channels, configured to supply the coolant to the plurality of coolant channels,
   wherein the plurality of airflow control plates include a first control plate and a second control plate, the first control plate being closer to the fan than the second control plate in the passage of the cooling fluid, the flow resistance of the second control plate to the cooling fluid being lower than the resistance of the first control plate.

* * * * *